(12) United States Patent
Pueschner et al.

(10) Patent No.: US 10,198,684 B2
(45) Date of Patent: Feb. 5, 2019

(54) SMART CARD MODULE, SMART CARD, AND METHOD FOR PRODUCING A SMART CARD MODULE

(71) Applicant: INFINEON TECHNOLOGIES AG, Neubiberg (DE)

(72) Inventors: Frank Pueschner, Kelheim (DE); Alfred Haimerl, Sinzing (DE); Jens Pohl, Bernhardswald (DE); Wolfgang Schindler, Regenstauf (DE)

(73) Assignee: Infineon Technologies AG, Neubiberg (DE)

(*) Notice: Subject to any disclaimer, the term of this patent is extended or adjusted under 35 U.S.C. 154(b) by 98 days.

(21) Appl. No.: 14/719,374

(22) Filed: May 22, 2015

(65) Prior Publication Data

US 2015/0339565 A1 Nov. 26, 2015

(30) Foreign Application Priority Data

May 23, 2014 (DE) ........................ 10 2014 107 299

(51) Int. Cl.
| | |
|---|---|
| *H01L 21/56* | (2006.01) |
| *G06K 19/077* | (2006.01) |
| *H01L 23/498* | (2006.01) |
| *H01L 23/00* | (2006.01) |

(52) U.S. Cl.
CPC . *G06K 19/07747* (2013.01); *G06K 19/07722* (2013.01); *G06K 19/07769* (2013.01);
(Continued)

(58) Field of Classification Search
CPC ........ G06K 19/07769; H01L 2224/131; H01L 2224/45144; H01L 2924/00;
(Continued)

(56) References Cited

U.S. PATENT DOCUMENTS

| | | | |
|---|---|---|---|
| 6,095,423 A | 8/2000 | Houdeau et al. | |
| 2007/0249209 A1* | 10/2007 | Djordjevic | G11C 5/063 439/320 |

(Continued)

FOREIGN PATENT DOCUMENTS

| | | |
|---|---|---|
| CN | 103165564 A | 6/2013 |
| CN | 103579153 A | 2/2014 |

(Continued)

*Primary Examiner* — Thien M Le
*Assistant Examiner* — Tae W Kim
(74) *Attorney, Agent, or Firm* — Viering, Jentschura & Partner MBB (57) ABSTRACT

A smart card module includes a substrate having a first main surface and a second main surface, which is opposite the first main surface. The substrate has a plurality of plated-through holes, which extend through the substrate from the first main surface to the second main surface. The smart card module further includes a chip over the first main surface of the substrate, a first metal structure over the second main surface of the substrate, electrically insulating material, which covers the first metal structure, and a second metal structure over the electrically insulating material, wherein the second metal structure is electrically insulated from the first metal structure by the electrically insulating material. The chip is connected to the first metal structure by at least one first plated-through hole. The chip is connected to the second metal structure by at least one second plated-through hole.

20 Claims, 6 Drawing Sheets

(52) U.S. Cl.
CPC ........ *G06K 19/07775* (2013.01); *H01L 21/56* (2013.01); *H01L 23/49855* (2013.01); *H01L 23/49883* (2013.01); *H01L 24/45* (2013.01); *H01L 24/48* (2013.01); *H01L 24/49* (2013.01); *H01L 2224/45144* (2013.01); *H01L 2224/48095* (2013.01); *H01L 2224/48227* (2013.01); *H01L 2224/48228* (2013.01); *H01L 2224/49109* (2013.01); *H01L 2224/49171* (2013.01); *H01L 2924/00014* (2013.01); *H01L 2924/181* (2013.01)

(58) Field of Classification Search
CPC .. H01L 2924/014; H01Q 7/00; H01Q 1/2225; H01Q 1/38
USPC .......................................................... 235/488
See application file for complete search history.

(56) References Cited

U.S. PATENT DOCUMENTS

| | | |
|---|---|---|
| 2009/0200381 A1 | 8/2009 | Schober et al. |
| 2010/0067200 A1 | 3/2010 | Ewe |
| 2013/0146670 A1 | 6/2013 | Grieshofer et al. |
| 2014/0021264 A1 | 1/2014 | Pueschner et al. |
| 2014/0063723 A1 | 3/2014 | Ro et al. |
| 2014/0091450 A1 | 4/2014 | Pueschner et al. |
| 2014/0284386 A1* | 9/2014 | Finn .................... H01Q 1/2225 235/488 |

FOREIGN PATENT DOCUMENTS

| | | |
|---|---|---|
| CN | 103681521 A | 3/2014 |
| DE | 102008046407 A1 | 3/2010 |

* cited by examiner

SMART CARD MODULE, SMART CARD, AND METHOD FOR PRODUCING A SMART CARD MODULE

CROSS-REFERENCE TO RELATED APPLICATION

This application claims priority to German Patent Application Serial No. 102014107299.5, which was filed May 23, 2014, and is incorporated herein by reference in its entirety.

TECHNICAL FIELD

Various embodiments relate generally to a smart card module, a smart card, and a method for producing a smart card module.

BACKGROUND

In general, a broad application field can be provided for smart cards depending on the specific embodiments. Smart cards, or else chip cards or integrated circuit cards (ICCs), may include an integrated smart card module (also referred to as chip module) having at least one chip. The smart card module can be arranged in a smart card body.

A smart card can be a so-called "dual interface" smart card (DIF smart card), i.e. the smart card may include both a contact area structure, arranged on the smart card module, for example, for electrically connecting the smart card to a device, for example to a card reader, and an apparatus for wireless communication, which uses induction for data interchange and energy supply of the smart card, for example by the use of radio waves. The apparatus for wireless communication can also be referred to as an interface for wireless data transmission, a wireless interface, or a CL interface.

The wireless interface may include, for example, an antenna arranged in the smart card body. Said antenna is also referred to as smart card body antenna or booster antenna. The smart card body antenna can be designed in such a way that contactless data transfer between the smart card body antenna and an external device can take place. In other words, the booster antenna can be designed in such a way that it can receive and transmit electromagnetic information and energy from and to outside the smart card. In addition, the wireless interface may include an antenna in the smart card module. The booster antenna may be inductively coupled to the antenna of the smart card module or may couple inductively. In other words, the antenna of the smart card module can be designed in such a way that it can perform information and energy interchange by means of induction with the booster antenna. The antenna of the smart card module can additionally be electrically conductively connected to the chip.

Therefore, contactless data transfer may be enabled between the external device and the chip (from the external device to the chip and/or from the chip to the external device) by the booster antenna, the antenna in the smart card module and the electrically conductive connection to the chip.

Expressed by way of example, information can be transmitted from outside the card, which is provided by means of an external card reader, for example, to the at least one chip by virtue of the information first being received inductively by the booster antenna and then being transmitted inductively by the booster antenna to the antenna in the smart card module. The information can be transmitted from the antenna in the smart card module to the chip by the electrically conductive connection.

In a reverse direction, information can be transmitted from the chip to outside the card, for example to the external card reader, by virtue of information being transmitted from the chip to the antenna in the smart card module by the electrically conductive connection, which information is received inductively by the booster antenna. The information, for example in the form of electromagnetic radiation, for example radio waves, can be emitted by the booster antenna in such a way that it can be received inductively by the external card reader, for example.

The technology of the antenna arranged on the smart card module for inductive coupling to the booster antenna is also referred to as coil-on-module. Owing to the electrically conductive connection between the antenna and the chip, the antenna and the chip can typically be arranged on the same side of the substrate.

Typically, dual interface smart cards which use a wire-bonding technology can be produced by virtue of a fiber-reinforced substrate based on epoxy resin being used, which is metal-coated on both main sides and includes metal-coated through-holes, also referred to as PTH (plated-through hole) vias or PTHs. This type of substrate can have a good mechanical load-bearing capacity.

However, owing to the expensive fiber-reinforced substrate based on epoxy resin and owing to the production of the metal coatings on the main sides and the metal-coated passages, production costs are high.

Other types of substrates, for example substrates on the basis of polyethylene terephthalate (PET) with double-sided metalization, are less expensive, but cannot be used for wire-bonding methods, for example hot-bonding, with gold wires because thermal stability of the PET material is too low for the wire-bonding method, in which temperatures of more than 80° C. are typically used.

SUMMARY

A smart card module includes a substrate having a first main surface and a second main surface, which is opposite the first main surface. The substrate has a plurality of plated-through holes, which extend through the substrate from the first main surface to the second main surface. The smart card module further includes a chip over the first main surface of the substrate, a first metal structure over the second main surface of the substrate, electrically insulating material, which covers the first metal structure, and a second metal structure over the electrically insulating material, wherein the second metal structure is electrically insulated from the first metal structure by the electrically insulating material. The chip is connected to the first metal structure by at least one first plated-through hole. The chip is connected to the second metal structure by at least one second plated-through hole.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Reference is made in the following detailed description to the attached drawings, which form part of this description and in which specific embodiments in which the invention can be implemented are shown for illustrative purposes. In this regard, directional terminology such as "at the top", "at the bottom", "at the front", "at the rear", "front", "rear", etc. is used with reference to the orientation of the described figure(s). Since components of embodiments can be positioned in a number of different orientations, the directional terminology is used for illustrative purposes and is in no way restrictive. It goes without saying that other embodiments can be used and structural or logical amendments performed without departing from the scope of protection of the present invention. It goes without saying that the features of the various embodiments described herein can be combined with one another if not specifically stated otherwise. The following detailed description should therefore not be interpreted in a restrictive sense, and the scope of protection of the present invention is defined by the attached claims.

Within the scope of this description, the terms "connected" and "coupled" are used to describe both a direct and an indirect connection and direct or indirect coupling.

FIG. 1A to FIG. 1F show schematic sectional views of a smart card module 100 in accordance with various embodiments during various phases of its production. In this case, essential structures are illustrated for illustrative purposes as though they are arranged in the smart card module 100 in the sectional plane, even if one or more of the structures would not be in the same plane with an arrangement close to reality (such as, for example, in FIG. 1G) or would merely cross over, in one embodiment.

Figure 1A:
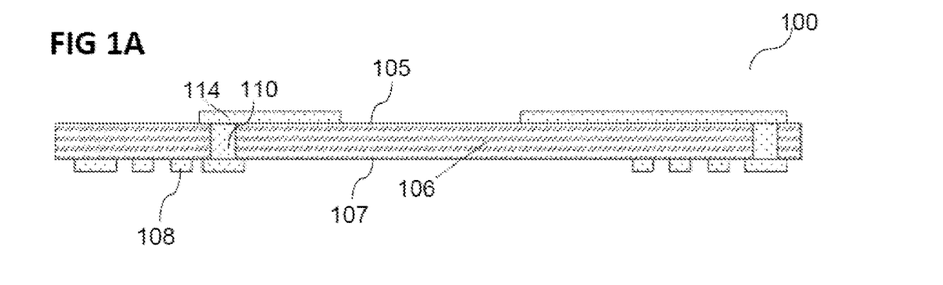
FIGS. 1A to 1F show schematic sectional views of a smart card module in accordance with various embodiments during various phases of its production.

In various embodiments, the smart card module 100 as illustrated in FIG. 1A may include a substrate 106 including a first main surface 105 and a second main surface 107, which is opposite the first main surface.

The substrate 106 may include a dielectric material or substantially consist of such a material. The dielectric material can be inexpensive; it may be, for example, a plastic material, for example a polymer. The polymer may be, for example, a polyester, for example PET or polyethylene naphthalate (PEN), or a polyimide (PI). Alternatively, the substrate 106 may include another cost-effective dielectric material.

In various embodiments, the smart card module 100 may include a first metal structure 108. The first metal structure 108 may consist partially or completely of an antenna 108, for example. The first metal structure 108 may be arranged over, for example, on, the second main surface 107 of the substrate 106. The first metal structure 108 may be arranged in a plane which is essentially parallel to the second main surface 107.

The first metal structure 108 may include an electrically conductive material. It may include or essentially consist of at least one of the following materials, for example: a metal, a metallic material, an alloy, an intermetallic compound, copper, aluminum, titanium, titanium nitride, tungsten, gold, silver, nickel, zinc, an aluminum-silicon alloy.

The first metal structure 108 may be formed by forming a layer on or over the substrate 106 and etching the layer, for example by copper etching technology or by aluminum etching technology.

In various embodiments, the first metal structure 108 (for example the antenna 108) may include or essentially consist of an individual conductive line. The first metal structure 108 may be arranged in the plane in such a way that it is formed around a region, for example around a rectangular or square region. In various embodiments, the first metal structure 108, as illustrated in FIG. 1G, can be formed as a flat spiral around the rectangular or square region.

In various embodiments, the smart card module 100 may include a further metal structure 114, for example a structured further metal structure 114. The further metal structure 114 may be arranged over the first main surface 105 of the substrate 106.

The further metal structure 114 may be formed by forming a metal layer on or over the substrate 106 and etching the metal layer.

Figure 1B:
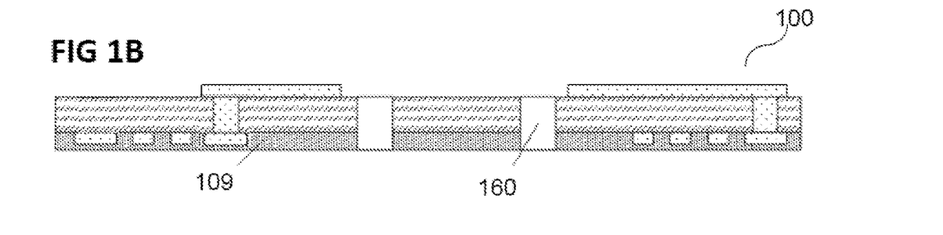

In various embodiments, the substrate 106 may include at least one plated-through hole 110, 160 (for the plated-through hole 160 see, for example, FIG. 1B).

A plated-through hole is understood to mean an opening which is formed through a material, for example by punching, etching, laser drilling or drilling and which is designed in such a way that electric current can be conducted through said plated-through hole, for example by an electrically conductive coating, for example along an inner surface of the opening, or by a conductor, for example a wire or a pin which is introduced into the opening. For reasons of simplicity, an opening which is provided only later with the conductor or the conductive coating is also already referred to as a plated-through hole, for example the plated-through hole 160 in FIG. 1B, in which an electrically conductive connection 168 is first arranged in FIG. 1F.

The plated-through hole 110 may include or essentially consist of an electrically conductive material. For example, an inner surface of the opening may be electrically conductively coated, for example metalized, or the opening may be filled with an electrically conductive material. In various embodiments, the plated-through holes 110, 160 may have a diameter in a range of approximately 0.3 mm to 1.5 mm, for example from approximately 0.5 mm to approximately 1 mm.

In various embodiments, an electrically conductive connection may be produced between the first metal structure 108 and the further metal structure 114 by the plated-through hole 110.

As illustrated in FIG. 1B, the smart card module 100 may, in various embodiments, include a layer 109 consisting of an electrically insulating material, also referred to as dielectric layer 109.

The electrically insulating material 109 may cover the first metal structure 108.

In various embodiments, the dielectric layer 109 may include a dielectric, for example a polymer, for example silicone, polyethylene terephthalate (PET), polyvinyl chloride (PVC) or polycarbonate (PCB). The dielectric layer 109 may include an adhering agent, for example an adhesive, for example silicone. The dielectric layer 109 may include, for example, an adhering agent, for example an adhesive, which can be used for lamination of a second metal structure 162 (see FIG. 1C) over the first metal structure 108 and over the substrate 106, for example an adhesive which can be used for cold-lamination, or for example a thermoplastic, which develops an adhesive effect after heating beyond its melting point, for example during a lamination process. The adhesive effect can still remain even after cooling of the dielectric layer 109.

In various embodiments, the smart card module 100 may include plated-through holes 160, which can be formed through the substrate 106 and the dielectric layer 109.

Figure 1C:
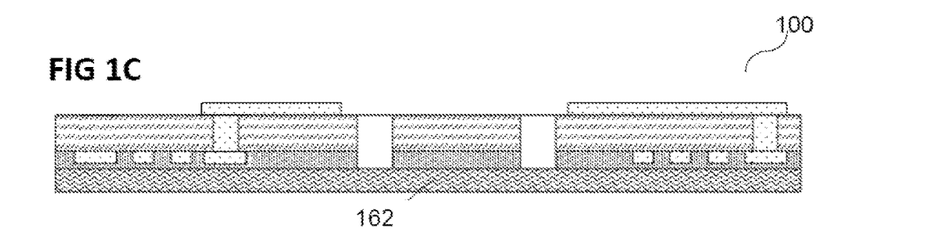

As illustrated in FIG. 1C, the smart card module 100 may, in various embodiments, include a second metal structure 162. The second metal structure 162 may be arranged or can have been arranged over the dielectric layer 109. In this case, the second metal structure 162 may be or may have been arranged such that it at least substantially covers a lower end of the opening of the plated-through hole 160, which can be arranged in the dielectric layer 109.

The second metal structure 162 may be a metal layer, for example a copper layer or a copper alloy layer, or may essentially consist of metal. It may include at least one metal of Cu, Al, Au, Ag, Pt, Ti, Ni, Sn, Zn and Pb, for example.

The second metal structure 162 may have a thickness in a range of from approximately 5 µm to approximately 100 µm, for example from approximately 10 µm to approximately 50 µm, for example from approximately 12 µm to approximately 30 µm.

In various embodiments, the second metal structure 162 may have been laminated onto the second main surface 107 of the substrate 106 and the first metal structure 108, for example by a dielectric layer 109 in the form of an adhering agent, for example an adhesive. In other words, the second metal structure 162 may have been adhesively bonded to the second main surface 107 and the first metal structure 108 by the adhering agent 109. The second metal structure 162 can be arranged over the first metal structure 108 in such a way that no direct electrically conductive contact is produced between the first metal structure 108 and the second metal structure 162. In other words, the dielectric layer 109 can be arranged between the first metal structure 108 and the second metal structure 162 in such a way that it electrically insulates the first metal structure 108 from the second metal structure 162.

Figure 1D:
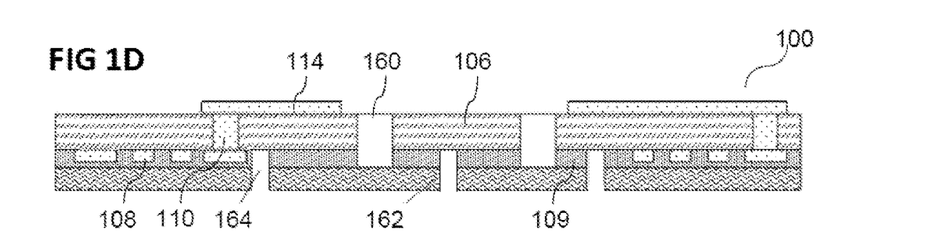

As illustrated in FIG. 1D, the second metal structure 162 may, in various embodiments, be structured or have been structured. During structuring of the second metal structure 162, in addition the dielectric layer 109 may be structured. The structuring of the second metal structure, and possibly of the dielectric layer 109, may take place by lithographic and etching methods. For example, nonconductive structures 164, for example in the form of openings, furrows, etc., can be arranged in the second metal structure 162 and possibly in the dielectric layer 109.

Figure 1E:
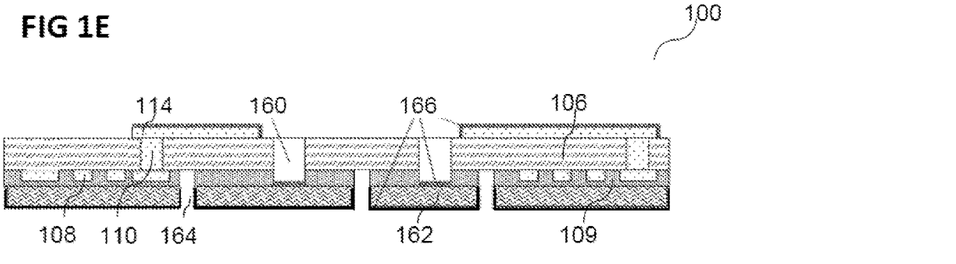
Figure 1F:
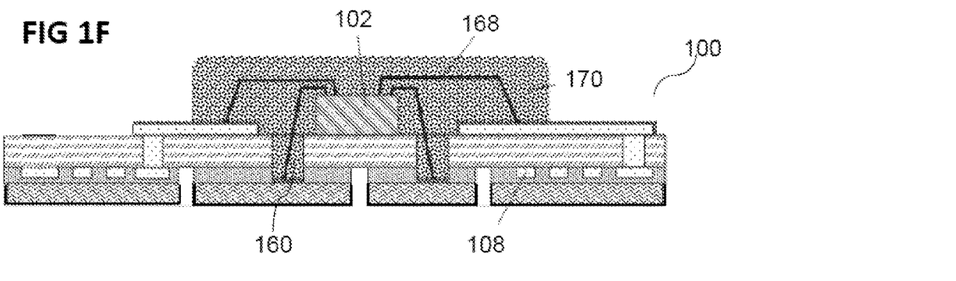
Figure 1G:
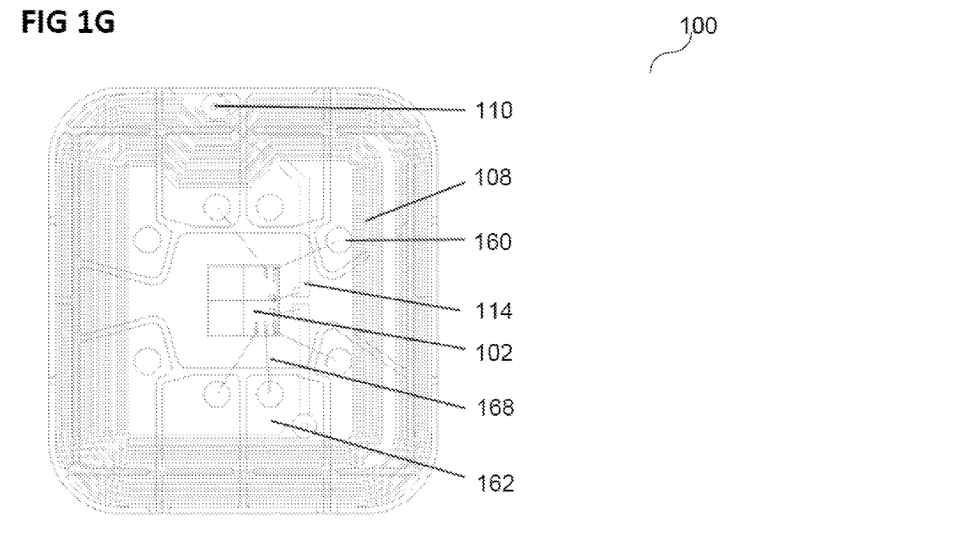
FIG. 1G shows a superimposed illustration of structures of the smart card module shown in FIGS. 1A to 1F.
Figure 2A:
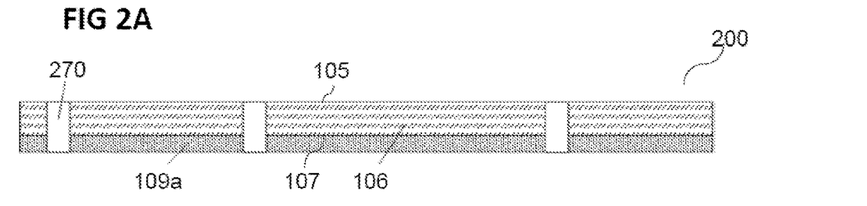
FIGS. 2A to 2D show schematic sectional views of a smart card module in accordance with various embodiments during various phases of its production.
Figure 2B:
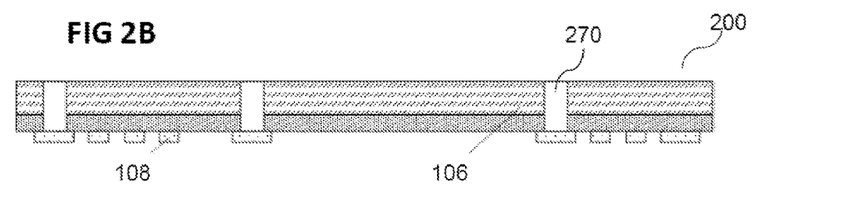
Figure 2C:
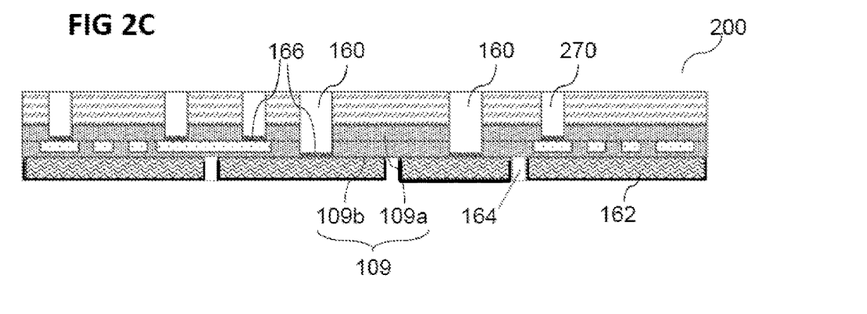
Figure 2D:
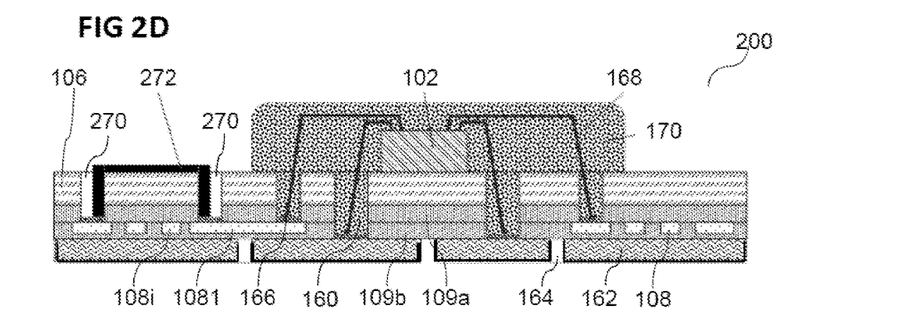
Figure 2E:
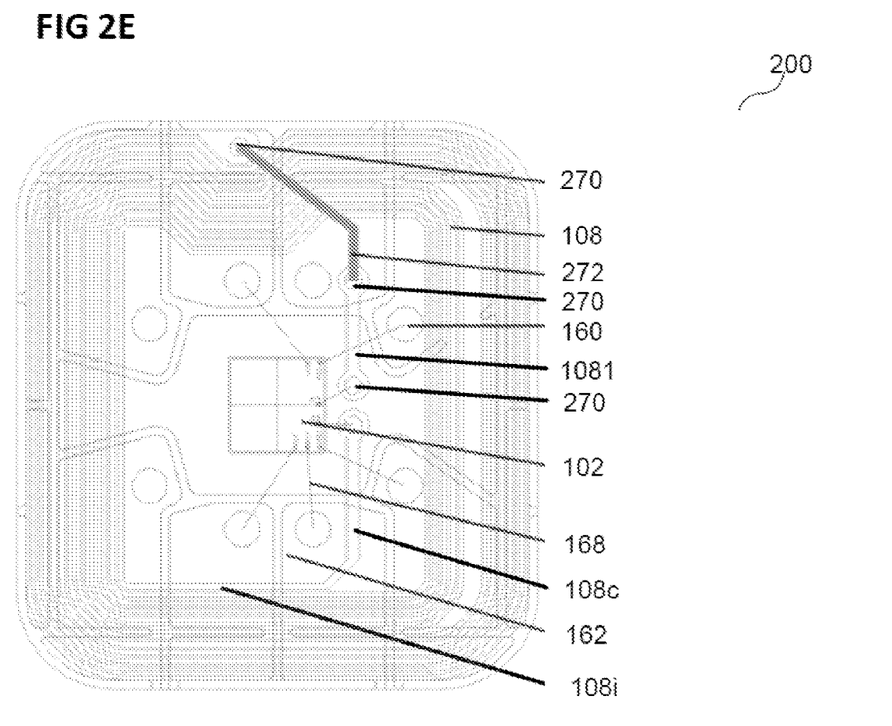
FIG. 2E shows a superimposed illustration of structures of the smart card module shown in FIGS. 2A to 2D.
Figure 3:
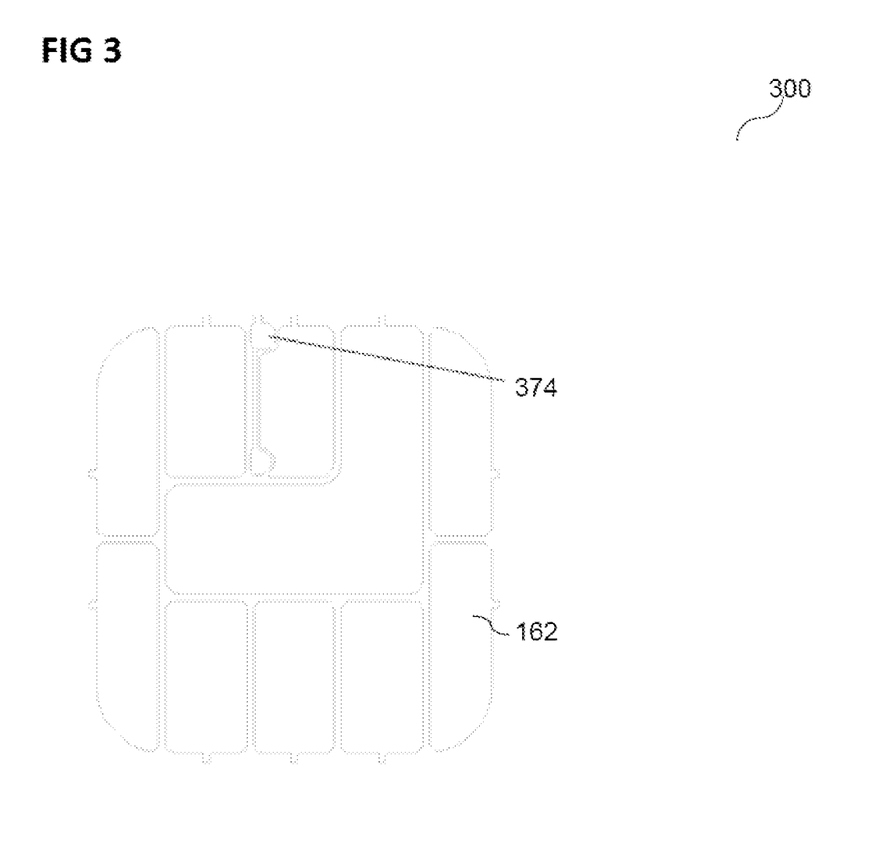
FIG. 3 shows a contact array of a smart card module in accordance with various embodiments.

In various embodiments, a contact array 162 including a plurality of electrical contacts which are electrically insulated from one another by the nonconductive structures 164 may be formed by the structuring of the second metal structure 162 (see, for example, FIG. 1G, FIG. 2E, FIG. 3 and the respective associated descriptions).

As illustrated in FIG. 1E, a layer 166 may be or may have been arranged over exposed metal areas of the smart card module 100. The layer 166 may be arranged, for example, in a direction toward the first main surface 105 and/or in a direction toward the second main surface 107. Described by way of example, the layer 166 may be applied from above the first main surface 105 toward the first main surface so that the layer 166 is formed both above the first main surface 105, for example over the further metal structure 114, and over further exposed metal areas, which are achieved in the described application direction, but may be arranged, for example, beneath the first main surface 105 (and also beneath the second main surface 107), such as, for example, the exposed layers of the second metal structure 162 in the at least one plated-through hole 160. Similarly, the layer 166 may be applied from beneath the second main surface 107 toward the second main surface 107 so that the layer 166 is formed both beneath the second main surface 107, for example over the second metal structure 162 (i.e. beneath and to the left and right thereof in FIG. 1E), and over further exposed metal areas (not illustrated), which are achieved in the described application direction.

Depending on the requirements, the layer 166 may, in various embodiments, include the same material over the first main surface 105 as over the second main surface 107, or the layer 166 may include different materials over the first main surface 105 and over the second main surface 107.

The layer 166 may be formed in one or more layers. The layer 166 may include that material which is suitable for providing a diffusion barrier and/or corrosion protection for the exposed metal areas, wherein the layer 166 which is formed in the plated-through holes 160 may furthermore be suitable for wire bonding, for example for wire bonding of a gold wire. The layer 166 may include or essentially consist of a combination of nickel with gold and/or palladium, for example. The layer 166 may be applied or have been applied by electroplating and/or by chemical coating, for example.

In various embodiments, the layer 166 may have a thickness in a range of from approximately 2 µm to approximately 10 µm, for example from approximately 5 µm to approximately 8 µm.

As illustrated in FIG. 1F, the smart card module 100, which may form a DIF smart card module 100 with wire-bonding technology, may furthermore include at least one chip 102, an encapsulation 170 and a plurality of electrically conductive connections 168.

The smart card module 100 may furthermore include further structures, which are used together with the chip 102, for example contact, protection or supporting structures, etc.

In various embodiments, the chip 102 may include a silicon main layer, for example a silicon substrate or a silicon wafer. The silicon main layer of the chip 102 may have a thickness in a range of from approximately 10 µm to approximately 200 µm, for example from approximately 30 µm to approximately 80 µm, for example in the region of approximately 50 µm, for example a thickness of less than or equal to 50 µm, for example 48 µm.

The chip 102 may be or have been arranged over the first main surface 105 of the substrate 106.

In addition, the chip 102 may include at least one metalization layer and at least one chip contact (neither illustrated).

In various embodiments, the chip 102 may include at least one integrated circuit, an electronic circuit, a memory chip or an RFID chip (a chip for identification by electromagnetic waves, namely "radiofrequency identification") or any other desired type of chip.

The chip 102 may be electrically conductively connected to the first metal structure (the antenna) 108 by the at least one plated-through hole 110. The chip 102 may be electrically conductively connected to the first metal structure 108, for example the antenna 108, for example by at least one of the electrical chip contacts, at least one of the electrically conductive connections 168, by the further metal structure 114 and by the plated-through hole 110. For example, the further metal structure 114 may be formed together with the first metal structure 108 and/or with the metal coating of the plated-through hole 110. The electrically conductive connection 168 may be soldered to the chip contact, for example, and may be electrically conductively connected to the further metal structure 114 by cold-bonding, for example.

The chip 102 may be electrically conductively connected to the antenna 108 for providing a functionality of wireless communication of the smart card module 100 in connection with a smart card body (not illustrated), in which a booster antenna can be arranged and with which the antenna 108 may be coupled inductively. The substrate 106 (and possibly the dielectric layer 109) can have as many plated-through holes 110 as necessary in order to electrically conductively and functionally connect the chip 102 to the antenna 108.

In various embodiments, the chip 102 may be electrically conductively connected to the second metal structure 162, for example to at least one of the contacts, by the at least one plated-through hole 160. The chip 102 may be electrically conductively connected to the second metal structure 162, for example, by the electrical chip contact and by at least one of the electrically conductive connections 168, which in this case forms the conductive part of the plated-through hole 160. The chip 102 may therefore be electrically conductively connected to the contact array 162 in order to provide a functionality of contact-based communication of the smart card module 100. The substrate 106 may include as many plated-through holes 160 as necessary in order to electrically conductively connect the chip 102, as envisaged, to the contacts of the contact array 162.

In various embodiments, the electrically conductive connections 168 may include any material which is suitable for being electrically conductively connected to the chip contacts on the chip 102, to the further metal structure 114 arranged over the substrate 106, to the first metal structure 108 and/or to the second metal structure 162, or to the layer 166 applied over the second metal structure 162 and over the further metal structure 114. The electrically conductive connections 168 may include or essentially consist of, for example, a metal or a metal alloy, for example gold. The electrically conductive connections 168 may be wires, which may also be referred to as bonding wires, for example gold wires. The bonding wires may have a length in a range of from approximately 0.5 mm to approximately 3 mm, for example from approximately 1.5 mm to approximately 2.5 mm.

In various embodiments, the smart card module 100 may also include an encapsulation 170. The encapsulation 170 may be configured such that it protects the chip 102, the electrically conductive connections 168 and points at which the electrically conductive connections 168 are connected to the chip 102, the further metal structure 114, the second metal structure 162, the first metal structure 108 and/or the layer 166, for example from mechanical loading and/or from damaging environmental influences, for example from moisture which could result in corrosion.

The encapsulation 170 may be applied over the first main surface 105 of the substrate 106. It may be arranged, for example, in such a way that, together with the structures on which it is formed, for example the further metal structure 114, the substrate 106, the layer 166 and/or the second metal structure 162, it seals off the chip 102 and/or the electrically conductive connections 168 hermetically with respect to a surrounding environment. In various embodiments, the encapsulation 170 may substantially completely cover the smart card module 100 from the first main surface 105. In other embodiments, the encapsulation 170 may be arranged in such a way that it only covers part of the smart card module 100 from the first main surface 105.

The encapsulation may include or essentially consist of a polymer. The formation of the encapsulation 170 may take place by molding, for example, in which a liquid molding compound, covering the chip 102 and the electrically conductive connections 168, is applied to the first main surface 105 in such a way that it covers the chip 102 and the bonding wires 168. The molding compound may cure after application. The molding compound may include epoxy resins, for example, and may be a thermosetting plastic.

FIG. 1G shows a superimposed illustration of structures in all planes of the smart card module 100 from FIG. 1A to FIG. 1F in accordance with various embodiments which are close to reality. Close to reality is in this case understood to mean that, in contrast to in the case of the sectional drawings in FIG. 1A to FIG. 1F, the structures are illustrated approximately as they would also be arranged in various embodiments, and not as lying on a common section plane to facilitate understanding.

FIG. 1G illustrates all of the metal structures 110, 108, 160, 114, 168 and 162 and the chip 102 of the smart card module 100 as plan views superimposed on one another.

This view shows that the plurality of electrical contacts of the contact array 162 may be arranged in the form of rows and columns, for example in the form of two rows, each having two columns, in the form of three rows, each having two columns, etc. The contacts of the contact array 162 may be arranged in accordance with the standard ISO 7816, for example.

The electrical contacts may have lateral dimensions in a range of from approximately 100 µm to approximately 15 mm, for example from approximately 500 µm to approximately 5 mm, for example approximately 2.5 mm.

The contact array 162 may be arranged in a smart card body in such a way that the contacts are exposed, so that contact, for example physical and electrical, may be made with said contacts by an external reader, for example.

In addition, FIG. 1G, in combination with FIG. 1F, shows that the individual contacts of the contact array 162 may be electrically conductively connected in each case to individual chip contacts of the chip 102 by the electrically conductive connections (the bonding wires) 168.

As can further be seen from the combination of FIG. 1F and FIG. 1G, a connection of the first metal structure 108, for example the antenna 108, to the chip 102 may be embodied in such a way that an electrically conductive connection to the chip 102, for example to in each case one of the chip contacts, is provided both from an inner end of the antenna 108, for example in the form of a flat spiral, and from an outer end of the antenna 108, by the further metal structure 114 arranged over the first main surface. The further metal structure 114 may be formed in such a way that it leads in each case from a plated-through hole 110, which is electrically conductively connected to the inner or outer end of the antenna 108, up to a region which is suitable for electrically conductive connection, by the electrically conductive connections 168, for example, of the respectively assigned chip contact to the further metal structure 114. A suitable region may be arranged, for example, in such a way that the electrically conductive connection 168 may be passed from the chip contact up to the assigned part of the further metal structure without crossing over other connections of the electrically conductive connections 168.

In other words, the antenna 108 may lie substantially in the plane of the first metal structure 108. Its connections may run, however, substantially by the further metal structure 114 on the first main surface 105 of the substrate 106 on which the chip 102 may also be arranged. An electrically conductive connection between the antenna 108 over the second main surface 107 of the substrate 106 and the further metal structure 114 over the second metal structure 162 may be provided by the plated-through holes 110.

FIG. 2A to FIG. 2D show schematic sectional views of a smart card module 200 in accordance with various embodiments during different phases of its production.

Some of the component parts, structures, methods etc. of the smart card module 200 correspond to those of the smart card module 100 described in connection with FIG. 1A to FIG. 1G, and therefore a renewed description has been dispensed with here. In FIG. 2A to FIG. 2E, they have been provided with the same reference symbols as in FIG. 1A to FIG. 1G.

As illustrated in FIG. 2A, in various embodiments the smart card module 200 may include a first main surface 105 and a second main surface 107, which is opposite the first main surface 105.

A first partial layer 109a of a dielectric layer 109 can be arranged over the second main surface 107. The first partial layer 109a of the dielectric layer 109 may essentially include the same materials and be applied using the same methods as described in connection with FIG. 1B. The first partial layer 109a may include an adhering agent, for example, or consist of an adhering agent.

In various embodiments, at least one plated-through hole 270 may be arranged in the substrate 106 and the first partial layer 109a. What is to be understood by a plated-through hole and how such a plated-through hole is formed has been described in connection with FIG. 1A.

As illustrated in FIG. 2B, in various embodiments a first metal structure 108 may be arranged over the first partial layer 109a of the dielectric layer 109. The first metal structure 108 may substantially correspond to the first metal structure 108 described in connection with FIG. 1A to FIG. 1G. For example, the first metal structure 108 from FIG. 2B may also be an antenna. In contrast to the embodiments described in FIG. 1A to FIG. 1G, the first metal structure 108 shown in FIG. 2B may be arranged on or over the first partial layer 109a of the dielectric layer 109. In this case, the first metal structure 108 may be arranged, for example formed, on or over the first partial layer 109a of the dielectric layer 109 in such a way that part of the first metal structure 108 is formed over the at least one plated-through hole 270. In other words, the first metal structure 108 may be arranged in such a way that it at least partially, for example substantially, covers the opening of the at least one plated-through hole 270 at a lower end, which may be arranged in the first partial layer 109a. Prior to application of the first metal structure 108, the opening of the at least one plated-through hole 270 may be filled, for example, with a material which is easily removable after application of the first metal structure 108.

As illustrated in FIG. 2C, the smart card module 200 may, in various embodiments, also include a second partial layer 109b of the dielectric layer 109, and a second metal structure 162 including nonconductive structures 164, at least one plated-through hole 160 and a layer 166. These structures, components, etc. may correspond to the respective structures, components, etc. described in connection with FIG. 1A to FIG. 1G.

In various embodiments, the second partial layer 109b of the dielectric layer 109 may be arranged over the first partial layer 109a of the dielectric layer 109 and over the first metal structure 108. The second partial layer 109b of the dielectric layer 109 may in this case be arranged over the first metal structure 108 in such a way that the first metal structure 108 is electrically insulated from the second metal structure 162 by the second partial layer 109b. In other words, no physical contact is formed between the first metal structure 108 and the second metal structure 162 because the second partial layer 109b of the dielectric layer 109 is arranged between the first metal structure 108 and the second metal structure 162. The second partial layer 109b may include, for example, an adhering agent or consist of an adhering agent.

In various embodiments, at least one plated-through hole 160 may be arranged in the substrate 106, the first partial layer 109a and the second partial layer 109b of the dielectric layer 109.

In various embodiments, the second metal structure 162 may be arranged over the second partial layer 109b of the dielectric layer 109. In this case, the second metal structure 162 may be arranged, for example formed, on or over the second partial layer 109b of the dielectric layer 108 in such a way that part of the second metal structure 109 is formed over the at least one plated-through hole 160. In other words, the second metal structure 162 may be arranged in such a way that it at least partially, for example substantially, covers the opening of the at least one plated-through hole 160 at a lower end, which may be arranged over the second partial layer 109b.

The layer 166 may be formed on exposed metal areas, which are accessible from a direction above the first main surface 105 (i.e. from above in FIG. 2C). In addition, the layer 166 may be formed on exposed metal areas which are accessible from a direction above the second main surface 107 (i.e. from below in FIG. 2C). The formation of the layer 166 may take place substantially as explained in connection with FIG. 1E and FIG. 1F. In various embodiments, the layer 166 may be formed in the plated-through holes 160, 270 in each case at the lower end thereof, which, in the case of the at least one plated-through hole 270, may lie in the first partial layer 109a of the dielectric layer 109 and may be covered at least partially by the first metal structure 108, on which the layer 166 can be formed. The lower end of the plated-through hole 160 may lie in the second partial layer 109b of the dielectric layer 109 and may be covered at least partially by the second metal structure 162, on which the layer 166 may be formed.

The second metal structure 162 may be a metal film, which may be arranged over the first partial layer 109a by the second partial layer 109b, which may be the adhering agent.

In contrast to the illustration in FIG. 2A and FIG. 2B, the for example already structured, first metal structure 108 may be arranged on a first partial layer 109a of the dielectric layer 109, which partial layer is in the form of an adhering agent film, and may be arranged over the second main surface 107 of the substrate 106 by the adhering agent film 109a. The adhering agent film 109a may provide a supporting and/or stabilizing function for the first metal structure 108. A material of the adhering agent film may include, for example, a thermoplastic, which has adhering agent properties during heating, for example beyond its melting point, for example in the case of a lamination process. The first metal structure 108 supported by the first partial layer 109 may be laminated, for example, onto the substrate 106, for example onto the second main surface 107.

In various embodiments, the first partial layer 109a may be arranged as adhering agent layer over a metal layer, which is intended to form the first metal structure 108 after structuring. The supporting or stabilizing function may in this case be provided at least partially by the metal layer. The metal layer may, as described above by way of example, be laminated onto the substrate 106, for example onto the second main surface 107 of the substrate 106. The metal structure 108 may be formed after lamination from the metal layer, for example by lithographic and etching methods. Then, the supporting or stabilizing function may be provided substantially by the substrate 106.

In various embodiments, the smart card module 200 may also have further partial layers (not illustrated) in addition to the partial layers 109a, 109b of the dielectric layer 109. For example, the partial layers 109a, 109b may include materials which do not have any adhering agent properties, and the further partial layers may be dielectric adhering agent layers.

In various embodiments, the first metal structure 108, for example the antenna 108, may be formed on the dielectric layer 109 and may be applied by the adhering agent 109a to the substrate 106.

In various embodiments, the first metal structure 108 may be substantially completely embedded in the dielectric layer 109, which may be arranged over the second main surface 107 of the substrate 106, for example between the partial layers 109a and 109b. The embedding may provide good protection against mechanical loading for the first metal structure 108, which may include the antenna 108, for example. As a result, the first metal structure 108 may be better protected from damage.

In various embodiments, the at least one plated-through hole 160 may be formed, for example by punching or by a laser, after the formation of the second partial layer 109b and prior to the formation and/or prior to the arrangement of the second metal structure 162.

In various embodiments, the at least one plated-through hole 160 may be formed, for example by lithographic and etching processes, after the formation of the second partial layer 109b and after the arrangement of the second metal structure 162 over the second partial layer 109b.

As illustrated in FIG. 2D, the smart card module 200, which may form a DIF smart card module 200 using wire-bonding technology, may, in various embodiments, additionally include at least one chip 102, an encapsulation 170, a connecting structure 272 and a plurality of electrically conductive connections 168. The chip 102, the encapsulation 170 and the conductive connections 168 may correspond to the respective structures, components, etc. described in connection with FIG. 1F and FIG. 1G.

In contrast to FIG. 1F and FIG. 1G, plated-through holes, for example the at least one plated-through hole 160 and the at least one plated-through hole 270, may be formed by substantially all of the conductive connections 168. The chip 102 may be electrically conductively connected to the first metal structure 108 by at least one plated-through hole 270. For example, the electrically conductive connection 168 may be electrically conductively connected to the first metal structure 108 by bonding, for example by wire bonding, and to the layer 166, for example by bonding, for example by cold-bonding. The chip 102 may additionally be electrically conductively connected to the second metal structure 162 by at least one plated-through hole 160. For example, the electrically conductive connection 168 may be electrically conductively connected to the second metal structure 162 by bonding, for example by wire bonding, and to the layer 166, for example, by bonding, for example by wire bonding.

Similarly to in FIG. 1F and FIG. 1G, a connection of the first metal structure (for example the antenna) 108 to the chip 102 may be implemented in such a way that an electrically conductive connection to the chip 102, for example to in each case one of the chip contacts, is provided both from an inner end of the antenna 108, embodied for example in the form of a flat spiral, and from an outer end of the antenna 108.

In contrast to FIG. 1F and FIG. 1G, in the case of the smart card module 200, in various embodiments a connecting structure 272 may be provided for producing an electrically conductive connection between the outer end of the antenna 108 and the chip 102. The connecting structure 272 may be electrically conductive; it may include an electrically conductive material, for example an electrically conductive ink. For example, the connecting structure 272 may be or include a printed electrically conductive connection. The connecting structure 272 may be arranged in at least two openings of the at least one plated-through hole 270 and therefore may be part (for example the conductive part) of the respective plated-through hole. One of the at least two plated-through holes 270 may be electrically conductively connected to the outer end of the antenna 108, for example the connecting structure 272 may be printed in such a way that an electrically conductive contact is formed between the connecting structure 272 and the first metal structure 108. The other of the at least two plated-through holes 270 may be electrically conductively connected to a connection part 1081, which may lie in the same plane as the first metal structure and can be formed together therewith. For example, the connecting structure 272 may be printed in such a way that an electrically conductive contact is formed between the connecting structure 272 and the first metal structure 108.

In various embodiments, the connecting structure 272 may be formed between the two plated-through holes 270 over the first main surface 105.

FIG. 2E shows a superimposed illustration of structures in all planes of the smart card module 200 shown in FIG. 2A to FIG. 2D in accordance with various embodiments which are close to reality. The term "close to reality" is to be understood here in precisely the same way as has already been explained in connection with FIG. 1G.

FIG. 2E shows all of the metal structures 270, 108, 160, 272, 168 and 162 and the chip 102 of the smart card module 200 as mutually superimposed plan views. The illustrated component parts, structures, etc. substantially correspond to the component parts, structures, etc. illustrated in FIG. 1G and explained in connection therewith.

In contrast to FIG. 1G, in various embodiments, the connecting structure 272 may be arranged in a smart card module 200 instead of the further metal structure 114. Therefore, the outer end of the antenna 108, as described in FIG. 2F, may be electrically conductively connected to the chip 102 by the connecting structure 272. The connecting structure 272 may be formed over the first main surface 105 in such a way that it leads from the plated-through hole 270, which is electrically conductively connected to the outer end of the antenna 108, up to one of the at least one plated-through holes 270 within an innermost turn 108*i* of the first metal structure 108, from where an electrically conductive connection may be provided by the connection part 108*1*, for example running in the plane of the first metal structure 108, to a region which is suitable for an electrically conductive connection, for example by the electrically conductive connection 168 in a further one of the at least one plated-through holes 270. A suitable region may be arranged, for example, in such a way that the electrically conductive connection 168 may be passed from the chip contact up to the plated-through hole 270 without crossing over other connections of the electrically conductive connections 168. An electrically conductive connection between the inner end of the antenna 108 and a region which is suitable for an electrically conductive connection, for example by one of the electrically conductive connections 168 in one of the at least one plated-through holes 270, may be provided, for example, by the part 108*c* of the first metal structure 108. In other words, the antenna 108, starting from its innermost turn 108*i*, may extend so far in the direction toward the chip 102 that electrically conductive contact may be made there with it by one of the plurality of electrically conductive connections 168, for example by wire bonding.

In other words, the antenna 108 together with its connections can lie substantially in the plane of the first metal structure 108 and may be electrically conductively connected by plated-through holes, apart from the conductive connections 168 and the connecting structure 272, which, making electrical contact with the outer end of the antenna 108 and crossing over the turns of the antenna 108, may extend over the first main surface 105 of the substrate 106 as far as into a region within the innermost turn 108*i* of the antenna 108.

FIG. 3 shows a contact array 162 of a smart card module 300 in accordance with various embodiments. If a sectional drawing similar to the sectional drawings in FIG. 1C to FIG. 1F or FIG. 2C and FIG. 2D were to be provided for the smart card module 300, FIG. 3 would illustrate a view from below of the smart card module 300.

The smart card module 300 may substantially correspond to one of the above-described smart card modules 100, 200, apart from the differences described here, and the component parts and structures are in this case used correspondingly together with their reference symbols in the mentioned figures.

Neither the further metal structure 114 nor the connecting structure 272, but rather a structure 374 on the contact array side, may be used for an electrically conductive connection between the outer end of the antenna 108 and the chip 102, in various embodiments of the smart card module 300.

The contact array 162 may be formed substantially in accordance with the standard ISO 7816, as described above. However, the contact array may include, in addition to the individual contacts of the contact array 162, which may be used for making physical and electrical contact with the chip 102 by an external reader, the structure 374 on the contact array side, which may be used to provide an electrically conductive connection between the outer end of the first metal structure 108 and the chip 102. The structure 374 on the contact array side can be arranged in such a way that it does not impair contact-making and data transfer between the chip 102 and an external reader by the contact array 162.

In addition, a plated-through hole may be provided between the structure 374 on the contact array side and the first main surface 105, for example through the substrate 106 and the dielectric layer 109, in order to produce electrically conductive contact between the structure 374 on the contact array side and the chip 102. The plated-through hole for connecting the structure 374 on the contact array side to the chip 102 may therefore be formed substantially as the plated-through hole 160. The structure 374 on the contact array side may be provided with the layer 166 on the side on which the plated-through hole is formed. The electrically conductive connection between the structure 374 on the contact array side and the chip 102 may be formed, for example, by one of the plurality of electrically conductive connections 168.

An electrically conductive connection between the structure 374 on the contact array side and the outer end of the antenna 108 may, in various embodiments, be formed by a plated-through hole. The plated-through hole may be formed in the dielectric layer 109 or in the partial layer 109*b*. It may be formed, for example, in a similar manner to the plated-through hole 110 in FIG. 1A to FIG. 1G, with the difference that it is not formed through the substrate 106, but through the dielectric layer 109.

In various embodiments, the inner end of the antenna 108 may be connected to the chip 102, for example, as illustrated and described in FIG. 2D and FIG. 2E.

Figure 4:
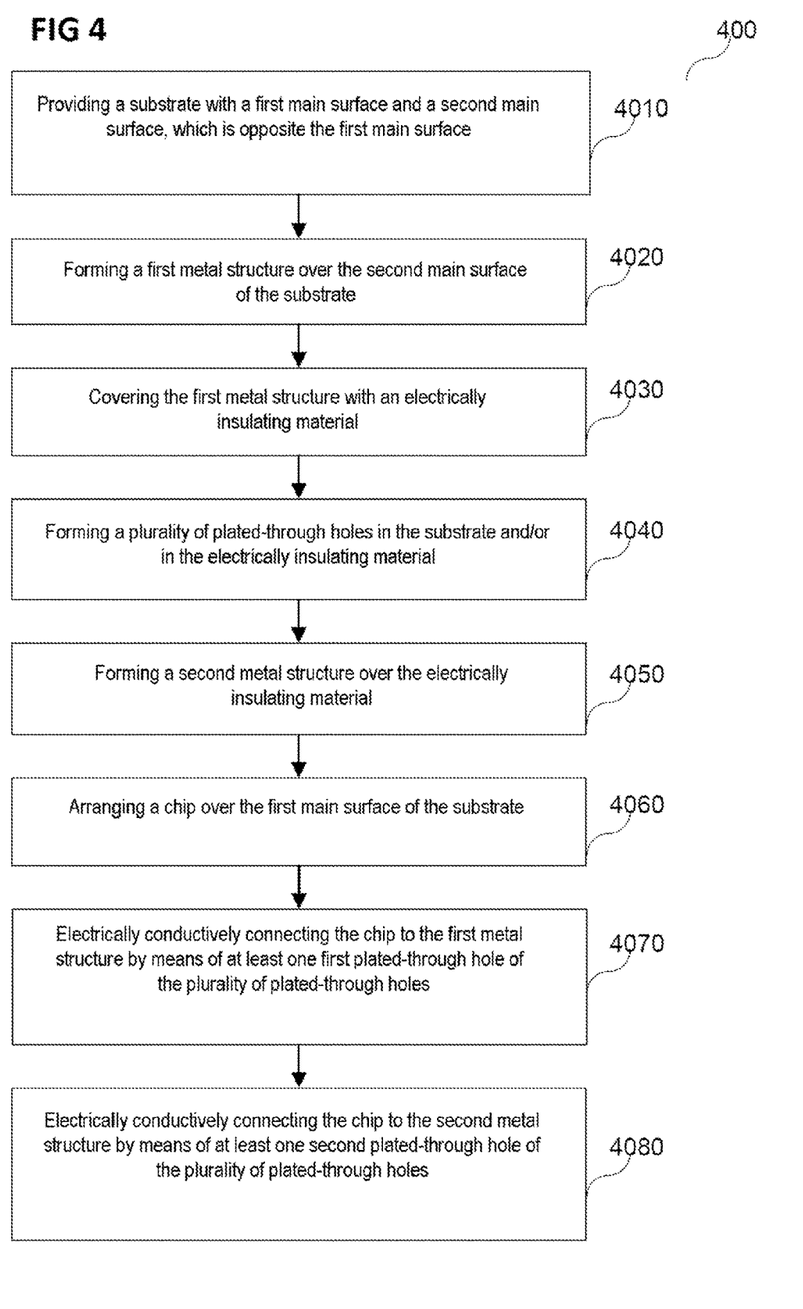
FIG. 4 shows a method for producing a smart card module in accordance with various embodiments.

FIG. 4 shows a method 400 for producing a smart card module in accordance with various embodiments.

The method 400 may include provision of a substrate with a first main surface and a second main surface, which is opposite the first main surface (in 4010). In addition, the method may include forming a first metal structure over the second main surface of the substrate (in 4020), and covering the first metal structure with an electrically insulating material (in 4030), forming a plurality of plated-through holes in the substrate and/or in the electrically insulating material (in 4040), forming a second metal structure over the electrically insulating material (in 4050), arranging a chip over the first main surface of the substrate (in 4060), electrically conductively connecting the chip to the first metal structure by at least one first plated-through hole of the plurality of plated-through holes (in 4070), and electrically conductively connecting the chip to the second metal structure by at least one second plated-through hole of the plurality of plated-through holes (in 4080).

In various embodiments, the plurality of plated-through holes may be formed by punching. Alternatively, the plurality of plated-through holes may be formed by etching, laser drilling or drilling. The first and second plated-through holes may be formed by the same method, or the first plated-through hole can be formed by a different method than the second plated-through hole.

In various embodiments, the second metal structure may be formed over the electrically insulating material by application by lamination. The second metal structure may be applied, for example, by cold lamination or hot lamination over, for example on, the electrically insulating material. The electrically insulating material may include, for example, an adhering agent, for example an adhesive, which adhesively connects the second metal structure to the electrically insulating material and to the substrate after the lamination process.

In various embodiments, the chip may be electrically conductively connected to the second metal structure by wire bonding. The wire bonding may include, for example, hot bonding of the wire to the second metal structure and to the chip, for example to a chip contact of the chip. Instead of direct wire bonding of the wire to the second metal structure, the wire may be bonded to a layer, which may be arranged on the second metal structure, for example a layer for protecting against corrosion. The wire may include gold, for example, or consist predominantly of gold.

In various embodiments, the chip may be electrically conductively connected to the first metal structure by wire bonding. The wire bonding may include, for example, hot bonding of the wire to the first metal structure and to the chip, for example to a chip contact of the chip. Instead of direct wire bonding of the wire to the first metal structure, the wire may be bonded to a layer, which may be arranged on the first metal structure, for example a layer for protecting against corrosion. The wire may include gold, for example, or essentially consist of gold.

Further advantageous configurations of the method are set forth in the descriptions of the smart card modules, and vice versa.

In various embodiments, an inexpensive substrate may be provided, for example a substrate which includes an inexpensive polymer, for example PET, or consists substantially therefrom. The substrate can be provided with a metal coating on both sides. The substrate can be combined with an additional metalization layer, which can be applied, for example laminated, onto the substrate. The combination of metal-coated substrate and additional metalization layer can be less expensive than conventional, for example fiber-reinforced, substrates and, in contrast to conventional favorable substrates, the substrate can be suitable for processing by gold-wire bonding. For example, wires, for example gold wires, can be bonded onto the additional metalization layer.

In addition, in the case of a smart card module which uses the combination of metal-coated substrate and additional metalization layer in accordance with various embodiments, at least one of the metal coatings, which may include the antenna, for example, can be arranged between inner layers of the smart card module. Thus, good mechanical protection and therefore a robust design can be provided.

In various embodiments, a method for producing an inexpensive and robust substrate combination for coil-on-module dual interface smart card modules which are suitable for wire bonding can be provided.

In other words, in various embodiments, an inexpensive substrate which is supplemented by an additional metalization layer such that it is suitable for (gold) wire bonding can be provided. The additional metalization layer can be arranged on or over the substrate, for example by lamination, and the substrate combination can be suitable for coil-on-module dual interface smart card modules.

In various embodiments, a smart card module is provided. The smart card module may include a substrate including a first main surface and a second main surface, which is opposite the first main surface, wherein the substrate may include a plurality of plated-through holes, which extend through the substrate from the first main surface to the second main surface. In addition, the smart card module may include a chip over the first main surface of the substrate, and a first metal structure over the second main surface of the substrate, electrically insulating material, which covers the first metal structure, and a second metal structure over the electrically insulating material. The second metal structure may be electrically insulated from the first metal structure by the electrically insulating material. The chip may be electrically conductively connected to the first metal structure by at least one first plated-through hole of the plurality of plated-through holes, and the chip may be electrically conductively connected to the second metal structure by at least one second plated-through hole of the plurality of plated-through holes.

In one configuration, the electrically insulating material may include at least one third plated-through hole. The first metal structure may be electrically conductively connected to the second metal structure by the at least one third plated-through hole.

In yet another configuration, the first metal structure may include an antenna.

In yet another configuration, the second metal structure may include a contact array.

In yet another configuration, the second metal structure may include a structure on the contact array side, which structure is electrically conductively connected to the first metal structure by a plated-through hole through the electrically insulating material.

In yet another configuration, the first plated-through hole may extend only through the substrate.

In yet another configuration, the first plated-through hole may extend through the substrate and through the electrically insulating material.

In yet another configuration, the second plated-through hole may extend through the substrate and through the electrically insulating material.

In yet another configuration, the smart card module may furthermore include an electrically conductive structure, which may be arranged at least partially over the first main surface. The antenna may be electrically conductively connected to the chip by the electrically conductive structure.

In yet another configuration, the electrically conductive structure, which is arranged over the first main surface, may be a metal structure, which is arranged over the first main surface by coating.

In yet another configuration, the electrically conductive structure, which is arranged over the first main surface, may be an electrically conductive ink, which is arranged over the first main surface by printing.

In yet another configuration, the second plated-through hole may include a bonded wire.

In yet another configuration, the first plated-through hole may include a bonded wire.

In yet another configuration, the bonded wire may include gold.

In yet another configuration, the second metal structure may include copper.

In various embodiments, a smart card is provided. The smart card may include a smart card module and a smart card body. The smart card module may be arranged in an opening in the smart card body.

In various embodiments, a method for producing a smart card module is provided. The method may include providing a substrate with a first main surface and a second main surface, which is opposite the first main surface, and forming a first metal structure over the second main surface of the substrate, covering the first metal structure with an electrically insulating material, forming a plurality of plated-through holes in the substrate and/or in the electrically insulating material, forming a second metal structure over the electrically insulating material, arranging a chip over the first main surface of the substrate, electrically conductively connecting the chip to the first metal structure by at least one first plated-through hole of the plurality of plated-through holes, and electrically conductively connecting the chip to the second metal structure by at least one second plated-through hole of the plurality of plated-through holes.

In one configuration, the plated-through holes may extend at least through the substrate from the first main surface to the second main surface.

In yet another configuration, the formation of the plurality of plated-through holes may include punching.

In yet another configuration, the formation of the second metal structure over the electrically insulating material may include application of a metal layer by lamination.

In yet another configuration, the electrically conductive connection of the chip to the second metal structure may include wire bonding.

In yet another configuration, the electrically conductive connection of the chip to the first metal structure may include wire bonding.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A smart card module, comprising:
a substrate comprising a first main surface and a second main surface, which is opposite the first main surface, wherein the substrate has a plurality of plated through holes, which extend through the substrate from the first main surface to the second main surface;
a chip over the first main surface of the substrate;
an antenna over the second main surface of the substrate;
electrically insulating material, which covers the antenna;
a second metal structure over the electrically insulating material;
a connecting structure configured to electrically conductively connect the chip to an outer end of the antenna by at least two plated-through holes of the plurality of plated-through holes; wherein the connecting structure has a first end, a second end, and a middle portion continuously connected between the first end and the second end; wherein the first end is arranged in a first plated-through hole, the second end is arranged in a second-plated through hole, wherein the connecting structure is arranged over the first main surface of the substrate; and
wherein the chip is electrically conductively connected to the second metal structure by the at least two plated-through holes of the plurality of plated-through holes; and wherein the second plated-through hole extends through the substrate and through the electrically insulating material.

2. The smart card module of claim 1,
wherein the electrically insulating material has at least one third plated-through hole; and
wherein the antenna is electrically conductively connected to the second metal structure by the at least one third plated-through hole.

3. The smart card module of claim 1,
wherein the second metal structure has a contact array.

4. The smart card module of claim 1,
wherein the second metal structure has a structure on the contact array side which is electrically conductively connected to the antenna by a plated-through hole through the electrically insulating material.

5. The smart card module of claim 1,
wherein the first plated-through hole extends only through the substrate.

6. The smart card module of claim 1,
wherein the first plated-through hole extends through the substrate and through the electrically insulating material.

7. The smart card module of claim 1, further comprising:
an electrically conductive structure, which is arranged at least partially over the first main surface, wherein the antenna is electrically conductively connected to the chip by the electrically conductive structure.

8. The smart card module of claim 1,
wherein the second plated-through hole has a bonded wire.

9. The smart card module of claim 8,
wherein the bonded wire comprises gold.

10. The smart card module of claim 1,
wherein the first plated-through hole has a bonded wire.

11. The smart card module of claim 1,
wherein the second metal structure comprises copper.

12. The smart card module of claim 1, wherein the connecting structure is disposed over the first main surface of the substrate.

13. The smart card module of claim 1, wherein the connecting structure comprises an electrically conductive ink.

14. A smart card, comprising:
a smart card module, comprising:
a substrate comprising a first main surface and a second main surface, which is opposite the first main surface, wherein the substrate has a plurality of plated-through holes, which extend through the substrate from the first main surface to the second main surface;
a chip over the first main surface of the substrate;
an antenna over the second main surface of the substrate;
electrically insulating material, which covers the antenna;
a second metal structure over the electrically insulating material and over the second main surface, wherein the second metal structure is electrically insulated from the antenna by the electrically insulating material;
a connecting structure configured to electrically conductively connect the chip to an outer end of the antenna by at least two plated-through holes of the plurality of plated-through holes; wherein the connecting structure has a first end, a second end, and a middle portion continuously connected between the first end and the second end; wherein the first end is arranged in a first plated-through hole, the second end is arranged in a second-plated through hole, wherein the connecting structure is arranged over the first main surface of the substrate; and
wherein the chip is electrically conductively connected to the second metal structure by the at least two plated-through poles of the plurality of plated-through holes; and wherein the second plated-through hole extends through the substrate and through the electrically insulating material;
a smart card body;
wherein the smart card module is arranged in an opening in the smart card body.

15. A method for producing a smart card module, the method comprising:

providing a substrate with a first main surface and a second main surface, which is opposite the first main surface;

forming an antenna over the second main surface of the substrate;

covering the antenna with an electrically insulating material;

forming a plurality of plated-through holes at least one of in the substrate or in the electrically insulating material;

forming a second metal structure over the electrically insulating material and over the second main surface;

arranging a chip over the first main surface of the substrate;

electrically conductively connecting the chip to an outer end of the antenna with a connecting structure by at least two plated-through holes of the plurality of plated-through holes; wherein the connecting structure has a first end, a second end, and a middle portion continuously connected between the first end and the second end; wherein the first end is arranged in a first plated-through hole, the second end is arranged in a second-plated through hole, wherein the connecting structure is arranged over the first main surface of the substrate; and electrically conductively connecting the chip to the second metal structure by the at least two plated-through holes of the plurality of plated-through holes; and wherein the second plated-through hole extends through the substrate and through the electrically insulating material.

16. The method of claim 15, wherein the plated-through holes extend at least through the substrate from the first main surface to the second main surface.

17. The method of claim 15, wherein the formation of the plurality of plated-through holes comprises punching.

18. The method of claim 15, wherein the formation of the second metal structure over the electrically insulating material comprises application of a metal layer by lamination.

19. The method of claim 15, wherein the electrically conductive connection of the chip to the second metal structure comprises wire bonding.

20. The method of claim 15, wherein the electrically conductive connection of the chip to the antenna comprises wire bonding.

* * * * *